United States Patent
Chung et al.

(10) Patent No.: US 8,481,398 B2
(45) Date of Patent: Jul. 9, 2013

(54) METHOD OF FORMING SEMICONDUCTOR DEVICE HAVING A CAPACITOR

(75) Inventors: Seung-Sik Chung, Seoul (KR);
Jung-Hee Chung, Suwon-si (KR);
Young-Jin Kim, Yongin-si (KR);
Seok-Woo Nam, Seongnam-si (KR);
Han-Jin Lim, Seoul (KR);
Kyoung-Ryul Yoon, Goyang-si (KR)

(73) Assignee: Samsung Electronics Co., Ltd., Samsung-ro, Yeongtong-gu, Suwon-si Gyeonggi-do (KR)

( * ) Notice: Subject to any disclaimer, the term of this patent is extended or adjusted under 35 U.S.C. 154(b) by 638 days.

(21) Appl. No.: 12/659,548

(22) Filed: Mar. 12, 2010

(65) Prior Publication Data
US 2010/0240191 A1    Sep. 23, 2010

(30) Foreign Application Priority Data
Mar. 18, 2009    (KR) .................. 10-2009-0023264

(51) Int. Cl.
*H01L 21/20*    (2006.01)
(52) U.S. Cl.
USPC .................. 438/396; 257/E21.651

(58) Field of Classification Search
USPC ........................................................ 438/396
See application file for complete search history.

(56) References Cited

U.S. PATENT DOCUMENTS

| | | | | |
|---|---|---|---|---|
| 5,445,986 | A * | 8/1995 | Hirota ................. | 438/398 |
| 6,500,763 | B2 * | 12/2002 | Kim et al. ............ | 438/689 |
| 6,822,280 | B2 * | 11/2004 | Ito et al. .............. | 257/296 |
| 7,008,837 | B2 | 3/2006 | Won et al. | |
| 7,153,740 | B2 * | 12/2006 | Kim et al. ............ | 438/253 |
| 2003/0224571 | A1 * | 12/2003 | Iijima et al. ......... | 438/253 |

FOREIGN PATENT DOCUMENTS

| | | |
|---|---|---|
| JP | 2005-064175 A | 3/2005 |
| KR | 10-2004-0076978 A | 9/2004 |
| KR | 10-2006-0011559 A | 2/2006 |

* cited by examiner

*Primary Examiner* — William D Coleman
(74) *Attorney, Agent, or Firm* — Muir Patent Consulting, PLLC

(57) ABSTRACT

A method of forming a semiconductor device includes forming a lower electrode layer on a substrate, forming a surface oxide layer on the lower electrode layer, partially removing the lower electrode layer to form a lower electrode, removing the surface oxide layer to expose the lower electrode, forming a capacitor dielectric layer on the lower electrode, and forming an upper electrode on the capacitor dielectric layer.

20 Claims, 13 Drawing Sheets

METHOD OF FORMING SEMICONDUCTOR DEVICE HAVING A CAPACITOR

BACKGROUND

1. Field

Example embodiments relate to a semiconductor device. More particularly, example embodiments relate to a method of forming a semiconductor device having a capacitor.

2. Description of the Related Art

Capacitors are widely employed in semiconductor devices, e.g., dynamic random access memory (DRAM) devices. Meanwhile, research into a technique of three-dimensionally arranging the capacitor to meet high-integration density of the semiconductor device is underway. In such a case, electrodes of the capacitor have a high aspect ratio. However, electrodes having a high aspect ratio may be susceptible to surface contamination, so electrical characteristics of the capacitor may be degraded.

SUMMARY

Embodiments are directed to a method of forming a semiconductor device having a capacitor, which substantially overcomes one or more of the problems due to the limitations and disadvantages of the related art.

It is therefore a feature of an embodiment to provide a method of forming a semiconductor device, while preventing surface contamination of a capacitor electrode therein.

At least one of the above and other features and advantages may be realized by providing a method of forming a semiconductor device, including forming a lower electrode layer on a substrate. A surface oxide layer may be formed on the lower electrode layer. The lower electrode layer may be partially removed to form a lower electrode. The surface oxide layer may be removed to expose the lower electrode. A capacitor dielectric layer may be formed on the lower electrode. An upper electrode may be formed on the capacitor dielectric layer.

The surface oxide layer may be formed using one or more of a pre-flow process, an oxidation process, a deposition process, and a combination thereof. The pre-flow process may use $O_3$, the oxidation process may use one or more of $O_2$, $O_3$, and $H_2O$, and the deposition process may use one or more of $O_2$, $O_3$, $H_2O$, a metal source gas, and a silicon source gas.

Forming the surface oxide layer may include forming a first oxide layer on the lower electrode layer using a pre-flow process or an oxidation process, and forming a second oxide layer on the first oxide layer using a deposition process. The deposition process may use one or more of $O_2$, $O_3$, $H_2O$, a metal source gas, and a silicon gas. The second oxide layer may be formed of an AlO layer.

A molding layer may be formed on the substrate before forming the lower electrode layer. The molding layer may be patterned to form a trench. The lower electrode layer may cover a sidewall of the trench. The molding layer may be formed by sequentially stacking a first molding layer, a second molding layer, and a third molding layer. The first molding layer, the second molding layer, and the third molding layer may have different etch selectivities.

The first molding layer may be a boro-phospho silicate glass (BPSG) layer, the second molding layer may be a tetra ethyl ortho silicate (TEOS) layer, and the third molding layer may be a low deposition rate tetra ethyl ortho silicate (LD-TEOS) layer.

A supporter layer may be formed between the second molding layer and the third molding layer. The supporter layer may be formed of a material layer having an etch selectivity with respect to the molding layer, and the lower electrode layer may be in contact with a sidewall of the supporter layer.

A sacrificial layer filling the trench may be formed on the lower electrode layer. Exposing the lower electrode may include removing the molding layer and the sacrificial layer. The sacrificial layer may be formed of a hydrocarbon-based organic polymer layer. The sacrificial layer may be formed of an organic node separate photoresist (ONSP) layer.

The lower electrode layer may be formed of one or more of a TiN layer, a TaN layer, a ZrN layer, a HfN layer, a NbN layer, a TiAlN layer, a TaAlN layer, a Ti layer, a Ta layer, a Zr layer, a Hf layer, a Nb layer, a Ru layer, a RuO layer, an Ir layer, and a Pt layer. The lower electrode may be thinner than the lower electrode layer.

Forming the surface oxide layer may include forming at least one oxide layer directly on the lower electrode layer by performing a pre-flow process and/or an oxidation process on the lower electrode layer. Forming the at least one oxide layer directly on the lower electrode layer may include forming a planarized interface between the at least one oxide layer and the lower electrode layer. The method may further include forming a sacrificial layer on the at least one oxide layer, such that the oxide layer is between the sacrificial layer and the lower electrode layer, wherein removing the surface oxide layer includes removing the at least one oxide layer and the sacrificial layer to expose the lower electrode.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
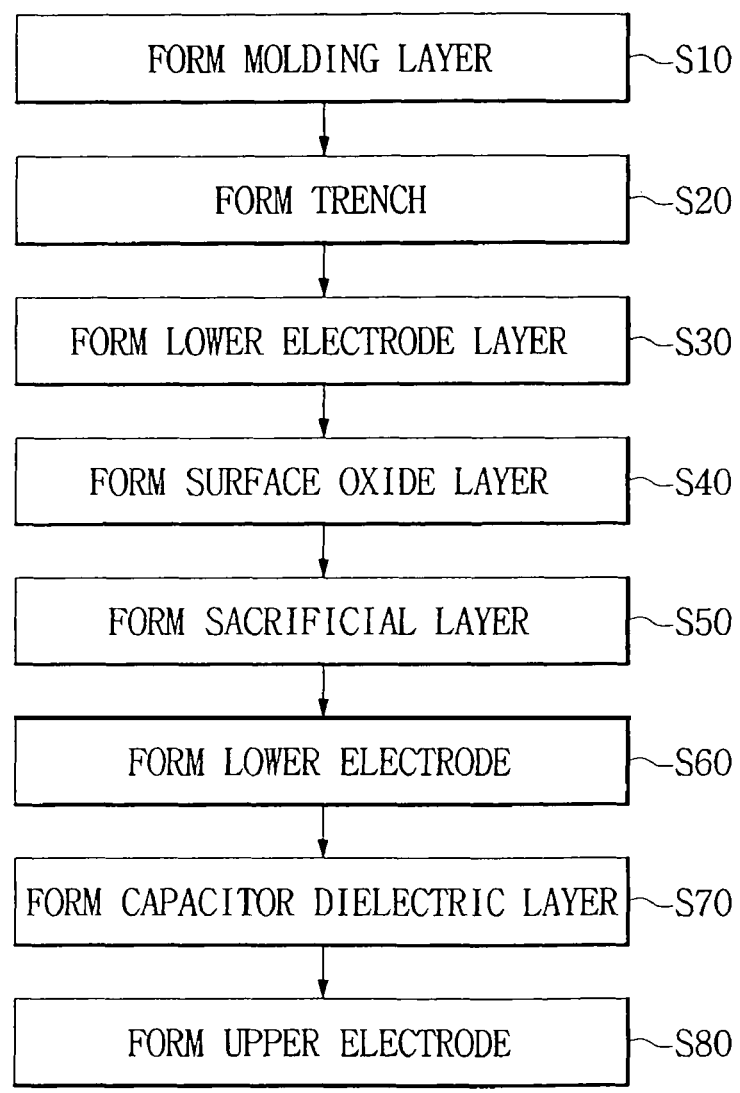
FIG. 1 illustrates a flowchart of a method of forming a semiconductor device having a capacitor according to example embodiments.

Korean Patent Application No. 10-2009-0023264, filed on Mar. 18, 2009, in the Korean Intellectual Property Office, and entitled: "Method of Forming Semiconductor Device Having Capacitor," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a flowchart of a method of forming a semiconductor device having a capacitor according to example embodiments. Referring to FIG. 1, the method of forming a semiconductor device having a capacitor may include forming a molding layer (S10), forming a trench (S20), forming a lower electrode layer (S30), forming a surface oxide layer (S40), forming a sacrificial layer (S50), forming a lower electrode (S60), forming a capacitor dielectric layer (S70), and forming an upper electrode (S80).

For example, the semiconductor device according to example embodiments may be a DRAM device having a micro pattern, e.g., about 40 nm or smaller. The DRAM device may employ, e.g., a one-cylinder storage (OCS) node capacitor. A lower electrode of the OCS node capacitor may be formed of a metal layer, e.g., TiN, and may be formed in the shape of a cylinder or a cup having a high aspect ratio, e.g., about 25:1 or greater.

As the capacitor of the semiconductor device according to example embodiments includes removal of the sacrificial layer and oxide layer from the lower electrode after operations (S40) through (S60) in FIG. 1, surface contamination of the lower electrode may be prevented or substantially minimized. That is, the surface oxide layer formed in operation (S40) may prevent or substantially minimize a sacrificial layer residue and pollutants included in the sacrificial layer from remaining on a surface of the lower electrode in subsequent operations. Therefore, surface contamination of the lower electrode may be prevented or substantially minimized, thereby minimizing degradation of electrical characteristics of the capacitor.

First Example Embodiment

Figure 2:
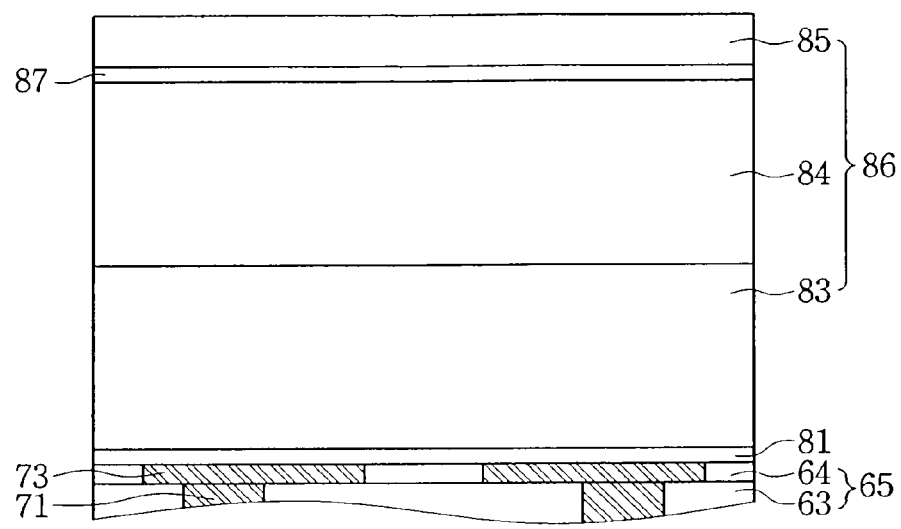
FIGS. 2-4, 6, 8, 9, 11, and 13 illustrate cross-sectional views of stages in a method of forming a semiconductor device having a capacitor according to example embodiments.
Figure 3:
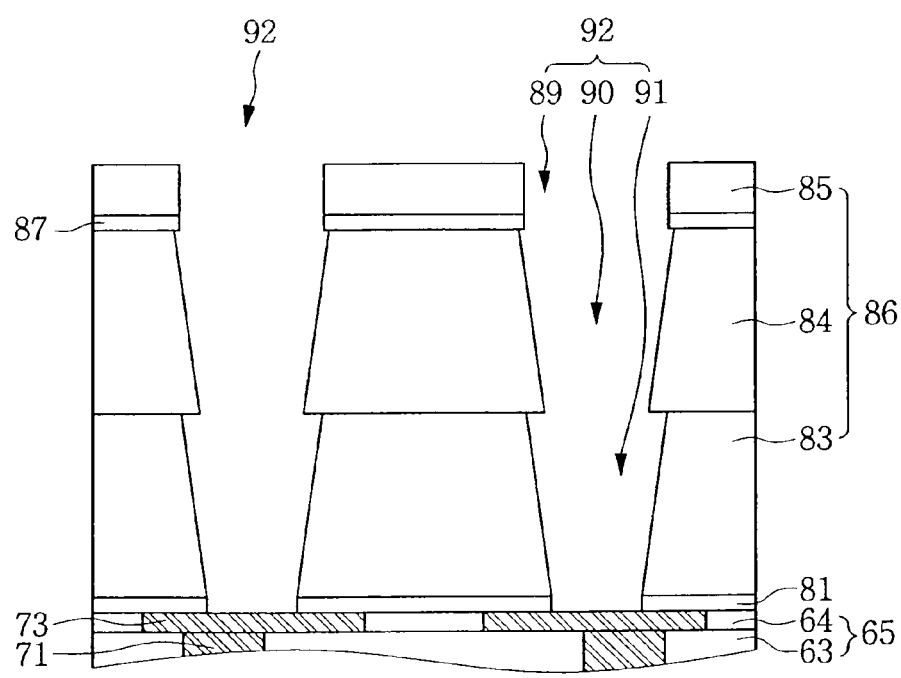
Figure 4:
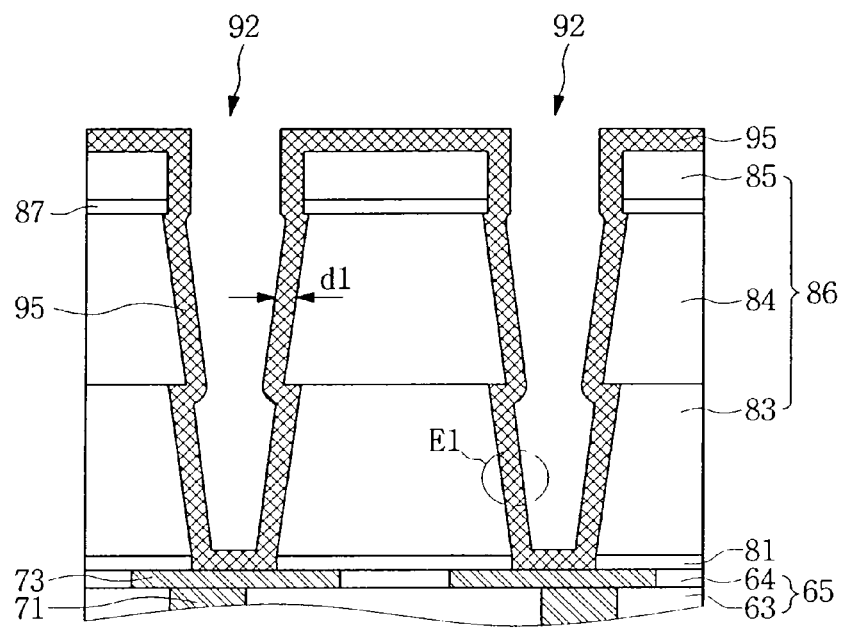
Figure 5:
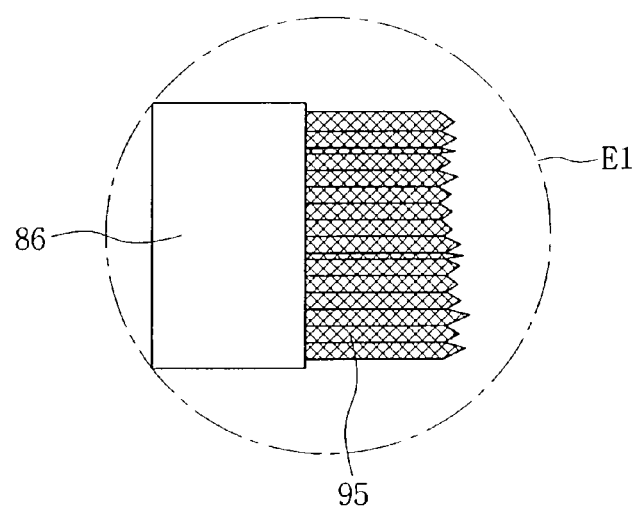
FIG. 5 illustrates an enlarged, detailed view of region E1 in FIG. 4.
Figure 6:
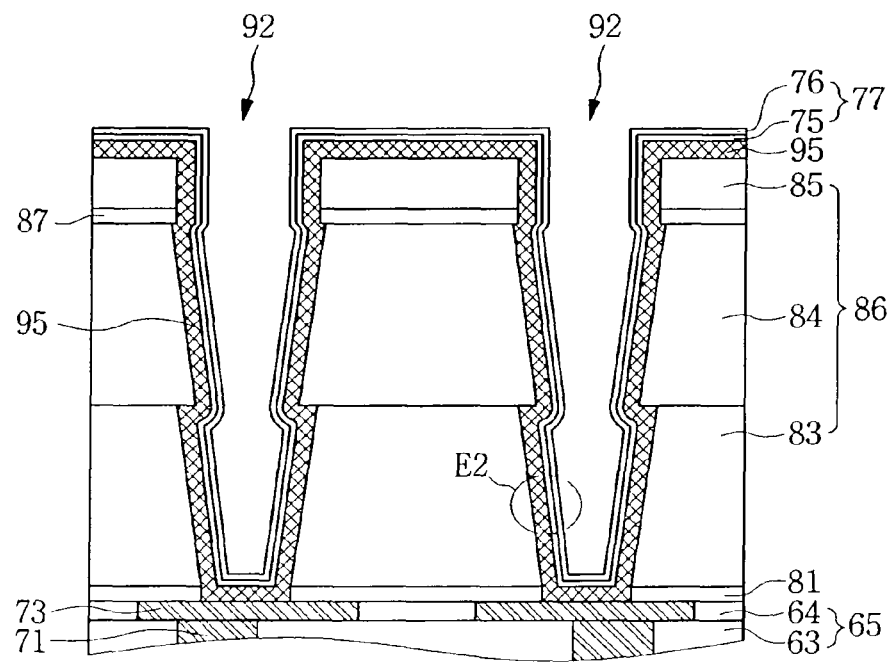
Figure 7:
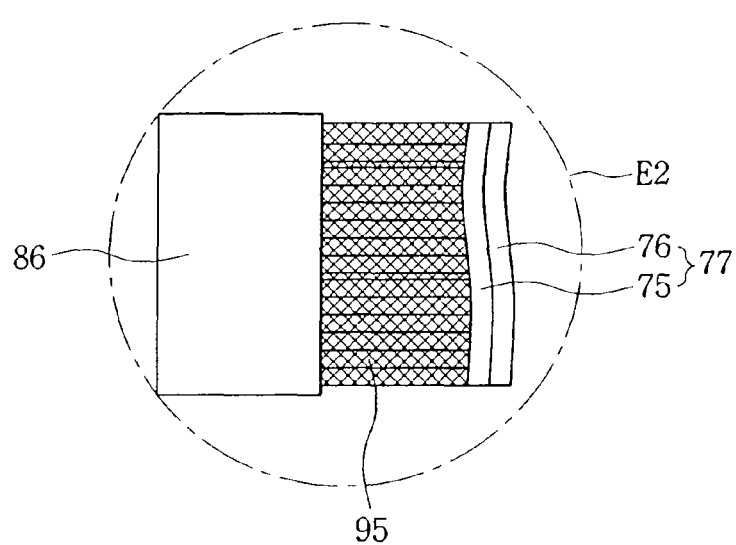
FIG. 7 illustrates an enlarged, detailed view of region E2 in FIG. 6.

FIGS. 2-4, 6, 8, 9, 11, and 13 illustrate cross-sectional views of stages in a method of forming a semiconductor device having a capacitor according to a first example embodiment. FIG. 5 illustrates a detailed view of E1 of FIG. 4, FIG. 7 illustrates a detailed view of E2 of FIG. 6, and FIG. 12 illustrates a detailed view of E3 of FIG. 11. FIG. 10 illustrates a plan view for assisting understanding of FIG. 9.

Referring to FIG. 2, a lower insulating layer 65, a buried contact plug 71, and a landing pad 73 may be formed on a substrate (not shown). The lower insulating layer 65 may include a first insulating layer 63 covering the substrate and a second insulating layer 64 covering the first insulating layer 63. The lower insulating layer 65 may be formed, e.g., of a silicon oxide layer, a silicon nitride layer, a silicon oxynitride layer and/or a combination thereof.

The buried contact plug 71 may penetrate the first insulating layer 63. The landing pad 73 may penetrate through the second insulating layer 64 to be on the first insulating layer 63. The landing pad 73 may be in contact with the buried contact plug 71. The lower insulating layer 65 and the landing pad 73 may be formed to have planarized top surfaces, so the top surfaces of the landing pad 73 and the second insulating layer 64 may be exposed on substantially the same plane, e.g., may be substantially coplanar. The landing pad 73 and the buried contact plug 71 may be formed of a conductive layer, e.g., a polysilicon layer, a metal silicide layer, a metal layer, a metal nitride layer and/or a combination thereof. The landing pad 73 and the buried contact plug 71 may be formed in plural number to be regularly arranged in row and column directions. The landing pad 73 may be omitted.

An etch stop layer 81, a first molding layer 83, a second molding layer 84, a supporter layer 87, and a third molding layer 85 may be sequentially formed on the substrate having the lower insulating layer 65 and the landing pad 73. The first molding layer 83, the second molding layer 84, and the third molding layer 85 may constitute a molding layer 86 (S10 of FIG. 1).

The etch stop layer 81 may be formed to cover the lower insulating layer 65 and the landing pad 73. The etch stop layer 81 may be formed of a material having an etch selectivity with respect to the molding layer 86. The etch stop layer 81 may be a material layer that is resistant to a gas and/or a solution for removing the molding layer 86. For example, the etch stop layer 81 may be formed of a material layer having a lower etch rate than the molding layer 86, e.g., an etch rate ratio of the molding layer 86 to the etch stop layer 81 may be about 100:1. The etch stop layer 81 may be formed of, e.g., a silicon nitride layer by a chemical vapor deposition (CVD) method.

The first molding layer 83, the second molding layer 84, and the third molding layer 85 may be formed of material layers having different etch selectivities. The first molding layer 83 may be formed of a material layer having a higher etch rate than the second molding layer 84. The second molding layer 84 may be formed of a material layer having a higher etch rate than the third molding layer 85. The first molding layer 83 may be formed of, e.g., a boro-phospho silicate glass layer (BPSG). The second molding layer 84 may be formed of, e.g., a tetra ethyl ortho silicate (TEOS) layer. The third molding layer 85 may be formed of, e.g., a low deposition rate tetra ethyl ortho silicate (LDTEOS) layer. The supporter layer 87 may be formed of a material layer having an etch selectivity with respect to the molding layer 86. The supporter layer 87 may be formed of a material layer that is resistant to a gas and/or a solution for removing the molding layer 86. For example, the supporter layer 87 may be formed of a material layer having a lower etch rate than the molding layer 86, e.g., an etch rate ratio of the molding layer 86 to the supporter layer 87 may be about 100:1. The supporter layer 87 may be formed of, e.g., a silicon nitride layer, by a CVD method. The supporter layer 87 may be omitted.

Referring to FIG. 3, the molding layer 86 may be patterned to form a trench 92 (S20 of FIG. 1). The trench 92 may extend through the entire molding layer 86, and may expose the landing pad 73.

In detail, the molding layer 86 may be patterned by photolithography and etching processes using a photoresist pattern and/or a hard mask pattern. More specifically, the third molding layer 85 may be, e.g., anisotropically, etched to form an upper trench 89, so the supporter layer 87 may be exposed on a bottom of the upper trench 89. Next, the supporter layer 87 may be removed to expose the second molding layer 84. Then, the second molding layer 84 may be, e.g., anisotropically, etched to form an intermediate trench 90, so the first molding layer 83 may be exposed on a bottom of the intermediate trench 90. The first molding layer 83 may be, e.g., isotropically, etched to form a lower trench 91, so the etch stop layer 81 may be exposed on a bottom of the lower trench 91. The etch stop layer 81 may be removed to expose the landing pad 73. It is noted that the lower trench 91, as well as the intermediate trench 90, may be expanded using an isotropic etching process.

As illustrated in FIG. 3, the upper trench 89 may be in communication with the lower trench 91 via the intermediate trench 90. The upper trench 89, the intermediate trench 90, and the lower trench 91 may constitute the trench 92. The landing pad 73 may be exposed on a bottom of the trench 92. That is, the trench 92 may sequentially penetrate the third molding layer 85, the supporter layer 87, the second molding layer 84, the first molding layer 83, and the etch stop layer 81. The trench 92 may be formed in the shape of, e.g., a cylinder or a cup, having a high aspect ratio of, e.g., about 25:1 or higher. The trench 92 may be formed in plural number to be regularly arranged in row and column directions to correspond to the landing pad 73 and/or the buried contact plug 71. For example, a plurality of trenches 92 may be formed, so each trench 92 may expose a corresponding landing pad 73.

An upper end region of the intermediate trench 90 may be formed to have a greater width than a lower end region of the upper trench 89. Also, an undercut region may be formed at a lower part of the supporter layer 87. The intermediate trench 90 may be formed in the shape of an inverted trapezoid, i.e., having a greater upper width than lower width. An upper end region of the lower trench 91 may be formed to have a greater width than a lower end region of the intermediate trench 90. In addition, an undercut region may be formed at a lower part of the second molding layer 84. Further, the lower trench 91 may be formed in the shape of an inverted trapezoid, i.e., having an upper width greater than a lower width.

Referring to FIGS. 4 and 5, a lower electrode layer 95 may be formed on the substrate having the trench 92 (S30 of FIG. 1). The lower electrode layer 95 may be formed of a conductive layer having an etch selectivity with respect to the molding layer 86. For example, the lower electrode layer 95 may be formed of one or more of a TiN layer, a TaN layer, a ZrN layer, a HfN layer, a NbN layer, a TiAlN layer, a TaAlN layer, a Ti layer, a Ta layer, a Zr layer, a Hf layer, a Nb layer, a Ru layer, a RuO layer, an Ir layer, a Pt layer, etc. For example, the lower electrode layer 95 may be formed conformally on the molding layer 86, and may have a first thickness d1.

The lower electrode layer 95 may cover an inner wall of the trench 92. As illustrated in FIG. 4, the lower electrode layer 95 may be formed to have a uniform thickness along the inner wall of the trench 92. The lower electrode layer 95 may cover the landing pad 73. That is, the lower electrode layer 95 may be in, e.g., direct, contact with the landing pad 73. When the landing pad 73 is omitted, the lower electrode layer 95 may be in contact with the buried contact plug 71. Moreover, the lower electrode layer 95 may be in contact with a sidewall of the supporter layer 87. The lower electrode layer 95 may be formed by, e.g., a physical vapor deposition (PVD) method, a chemical vapor deposition (CVD) method, an atomic layer deposition (ALD) method, a cyclic deposition method, an electroplating method, an electroless plating method, or a combination thereof. For example, the lower electrode layer 95 may be formed of a TiN layer by a PVD method. The lower electrode layer 95 may be formed of a conductive layer exhibiting a lower etch rate than the molding layer 86. For example, a ratio of an etch rate of the lower electrode layer 95 to an etch rate of the molding layer 86 may be about 1:100 or higher.

FIG. 5 illustrates a detailed view of region E1 of FIG. 4. The lower electrode layer 95 may have an uneven surface, e.g., the lower electrode layer 95 may have a columnar structure. That is, when the lower electrode layer 95 is formed on the molding layer 86, a surface of the lower electrode layer 95 facing away from the molding layer 86 may include an irregular texture, e.g., irregular columnar deviations relative to a surface of the molding layer 86 supporting the lower electrode layer 95. For example, the lower electrode layer 95 may be formed by depositing TiN layer on the molding layer 86, and a surface of the TiN layer facing away from the molding layer 86 may be uneven, i.e., non-flat.

Referring to FIGS. 6 and 7, a surface oxide layer 77 may be formed, e.g., conformally, on the lower electrode layer 95 (S40 of FIG. 1), e.g., on an entire surface of the lower electrode layer 95 within the trench 92. The surface oxide layer 77 may include a first oxide layer 75 covering the lower electrode layer 95 and a second oxide layer 76 covering the first oxide layer 75. The first oxide layer 75 and the second oxide layer 76 may be formed in an in-situ process. That is, the first oxide layer 75 and the second oxide layer 76 may be successively formed in the same equipment. However, embodiments are not limited thereto, e.g., only one of the first oxide layer 75 and the second oxide layer 76 may be formed.

In the first example embodiment, the first oxide layer 75 may be formed, e.g., by a pre-flow process using $O_3$ and/or by oxidation. For example, a portion of the lower electrode layer 95 may interact with oxygen atoms to transform into the first oxide layer 75. For example, when the lower electrode layer 95 is formed of a TiN layer, an $O_3$ pre-flow process may be performed on the TiN layer to form the first oxide layer 75 of a $TiO_2$ layer on the TiN layer. The second oxide layer 76 may be formed, e.g., by a deposition process, of a metal oxide layer, e.g., using a CVD method, an ALD method, a cyclic deposition method and/or a combination thereof. For example, the second oxide layer 76 may be formed of an AlO layer.

The first oxide layer 75 and the second oxide layer 76 may be formed to have uniform thicknesses along a surface of the lower electrode layer 95. As the first oxide layer 75 is formed by $O_3$ pre-flow process and/or oxidation, as illustrated in FIG. 7, the thickness of the lower electrode layer 95 may be reduced after formation of the first oxide layer 75 thereon. Further, as illustrated in FIG. 7, the surface of the lower electrode layer 95 facing away from the molding layer 86 may be planarized after formation of the first oxide layer 75 thereon, i.e., the $O_3$ pre-flow process and/or oxidation may smooth the uneven surface of the lower electrode layer 95.

In detail, the surface oxide layer 77 may be formed by, e.g., a pre-flow process, an oxidation process, a deposition process, or a combination thereof. The pre-flow process may include using $O_3$. The oxidation process may include using one or more of $O_2$, $O_3$, and $H_2O$. The deposition process may include using one or more of $O_2$, $O_3$, $H_2O$, a metal source gas, and a silicon source gas. For example, forming the surface oxide layer 77 may include forming the first oxide layer 75 using the pre-flow process and/or the oxidation process, and forming the second oxide layer 76 using the deposition process. The first oxide layer 75 may be formed to a thickness of about 0.1 nm to about 2 nm, e.g., about 1 nm.

Figure 8:
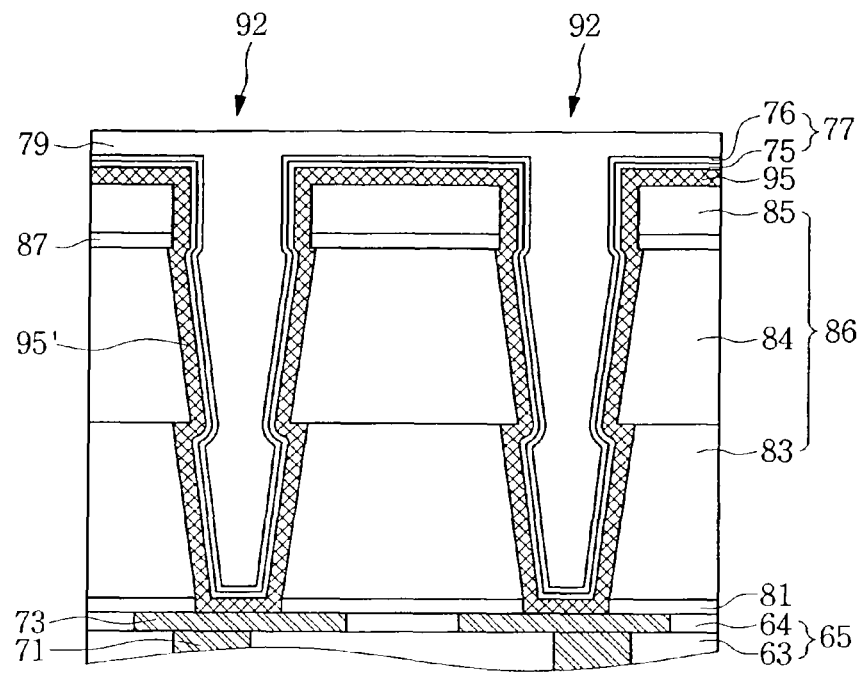

Referring to FIG. 8, a sacrificial layer 79 may be formed to fill, e.g., completely fill, the trench 92 and to cover the, e.g., entire, surface oxide layer 77 (S50 of FIG. 1). The sacrificial layer 79 may be formed, e.g., of a hydrocarbon-based organic polymer layer. When the sacrificial layer 79 is formed of the hydrocarbon-based organic polymer layer, it may exhibit excellent production efficiency. For example, the sacrificial layer 79 may be formed of an organic node separate photoresist (ONSP) layer. In another example, the sacrificial layer 79 may be formed of a silicon oxide layer, e.g., using a CVD method, an ALD method, and/or a cyclic deposition method. In yet another example, the sacrificial layer 79 may be omitted.

Figure 9:
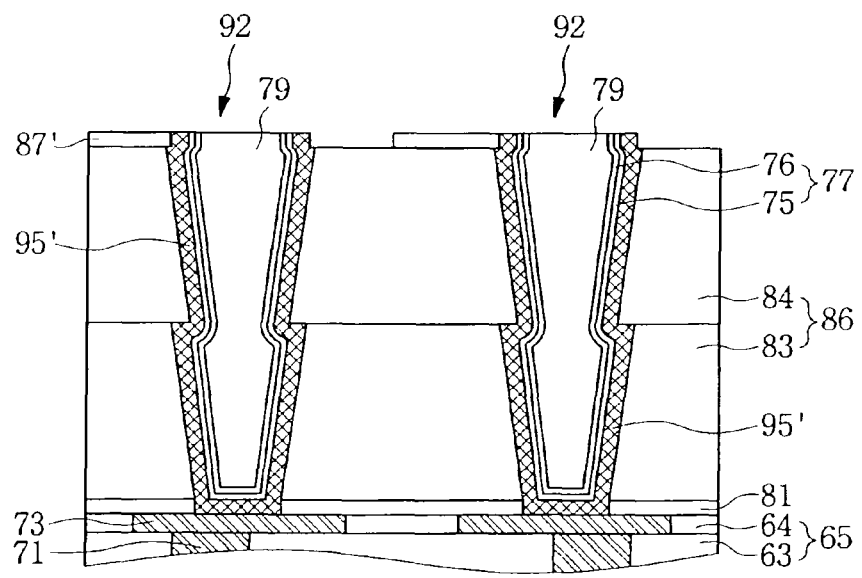
Figure 10:
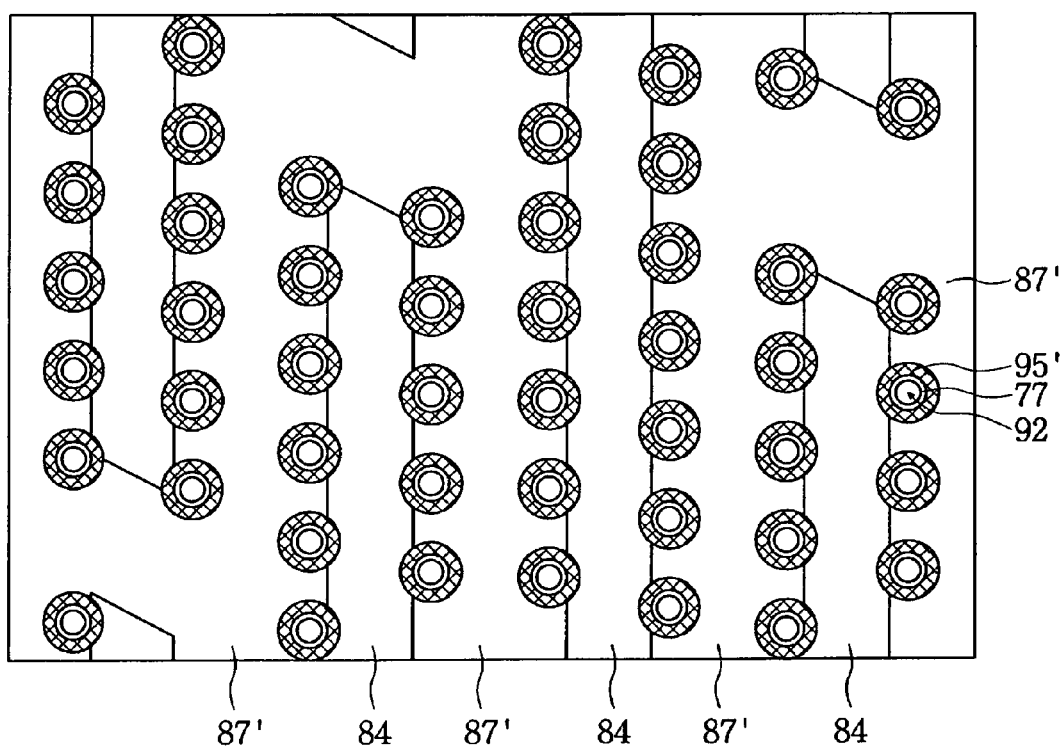
FIG. 10 illustrates a top plan view of an arrangement of a plurality of lower electrodes attached to a support pattern as illustrated in FIG. 9.

Referring to FIG. 9, the lower electrode layer 95 may be partially removed using a node splitting process to form a lower electrode 95' (S60 of FIG. 1). For example, upper portions of the lower electrode layer 95, e.g., portions on the third molding layer 85, may be removed to expose the top surface of the second molding layer 84. Therefore, portions of the lower electrode layer 95 inside the trench 92 may remain to define the lower electrode 95' in the trench 92. The lower electrode 95' may be in contact with the landing pad 73.

The node splitting process may include a CMP process, an etch-back process and/or a combination thereof. For example, the lower electrode 95' may be formed by a CMP process using the supporter layer 87 as a stop layer. In such a case, the third molding layer 85 may be completely removed with the portions of the lower electrode layer 95. As a result, top surfaces of the supporter layer 87, the lower electrode 95', the surface oxide layer 77, and the sacrificial layer 79 may be exposed on the same plane, e.g., be coplanar. The sacrificial layer 79 may remain in the trench 92. The surface oxide layer 77 may remain between the lower electrode 95' and the sacrificial layer 79.

Afterwards, the supporter layer 87 may be patterned to form a support pattern 87' partially exposing the second molding layer 84. The support pattern 87' may be formed by photolithography and/or etching processes.

In other example embodiments, the node splitting process may include partially removing the sacrificial layer 79, the surface oxide layer 77 and the lower electrode layer 95 until the third molding layer 85 is exposed. In such a case, the third molding layer 85 may remain on the supporter layer 87. Then, the third molding layer 85 and the supporter layer 87 may be successively patterned to partially expose the second molding layer 84.

In still other example embodiments, the node splitting process may include partially removing the sacrificial layer 79 to partially expose a top surface of the surface oxide layer 77. The sacrificial layer 79 may be partially removed using an exposure process and an ashing process. In such a case, the sacrificial layer 79 may be kept in the trench 92. Afterwards, the surface oxide layer 77 and the lower electrode layer 95 may be sequentially etched back to expose the third molding layer 85. As a result, the lower electrode layer 95 may be divided to form the lower electrode 95'. The lower electrode 95', the surface oxide layer 77, and the sacrificial layer 79 may be kept in the trench 92. Afterwards, the third molding layer 85 and the supporter layer 87 may be successively patterned to form the support pattern 87' partially exposing the second molding layer 84.

Referring to FIG. 10, the lower electrode 95' may be formed in plural number to be regularly arranged in row and column directions to correspond to the trench 92. The support pattern 87' may be formed in a line and space pattern to support the plurality of lower electrodes 95', as illustrated in FIG. 10. The support pattern 87' may be in contact with the lower electrode 95'. The second molding layer 84 may be partially exposed on a side of the lower electrode 95'.

Figure 11:
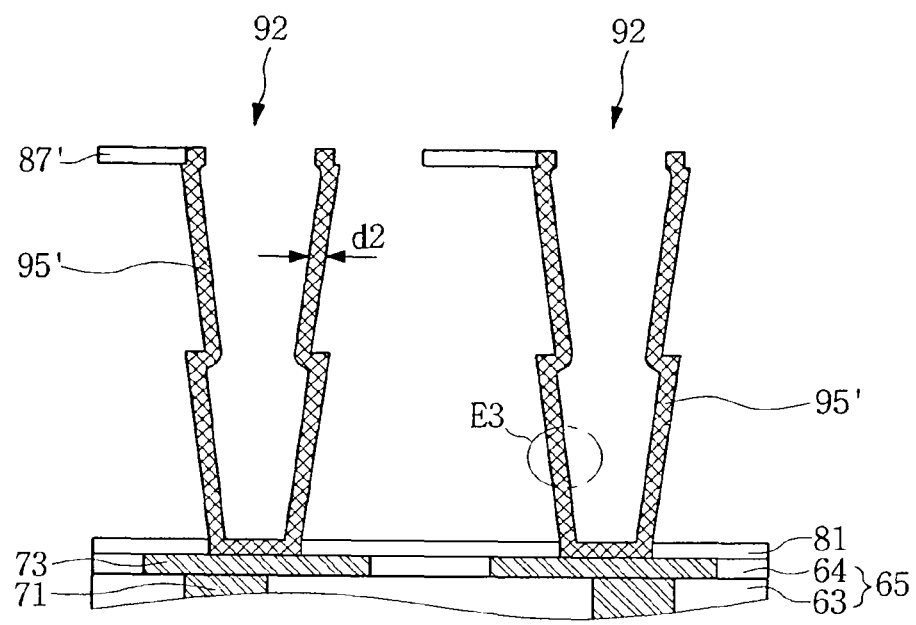
Figure 12:
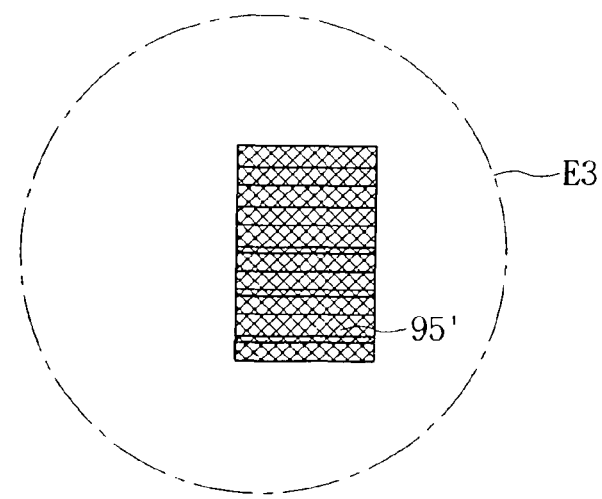
FIG. 12 illustrates an enlarged, detailed view of region E3 in FIG. 11.

Referring to FIGS. 11 and 12, the second molding layer 84, the first molding layer 83, the sacrificial layer 79, and the surface oxide layer 77 may be removed, e.g., via an ashing process, an isotropic etching process and/or a combination thereof, to expose the lower electrode 95'. As a result, as illustrated in FIG. 11, the support pattern 87' and the etch stop layer 81 may be exposed as well.

Removal of the surface oxide layer 77, while removing the sacrificial layer 79, may substantially reduce contaminants on the lower electrode 95'. For example, as formation of the surface oxide layer 77 on the lower electrode layer 95 planarizes the uneven surface of the lower electrode layer 95, an interface between the surface oxide layer 77 and the lower electrode layer 95 may be substantially smooth. As such, the surface oxide layer 77 may be easily removed, e.g., subsequently to or simultaneously with removal of the sacrificial layer 79, from the trench 92 without leaving residue or contaminants in the trench 92. In contrast, during a conventional method of forming a lower capacitor electrode having a high aspect ratio, e.g., without using a surface oxide layer, contaminants, e.g., polymer residue, may remain on the lower electrode, e.g., residue of the sacrificial layer may remain on an uneven surface of a lower electrode layer. Therefore, when the sacrificial layer 79 is removed with the surface oxide layer 77 according to example embodiments, removal of the surface oxide layer 77 may increase removal of pollutants from the trench 92, i.e., prevent or substantially minimize polymer residue in the trench 92. As a result, the surface oxide layer 77 may prevent surface contamination of the lower electrode 95'.

The lower electrode 95' may be formed to a second thickness d2. The second thickness d2 of the lower electrode 95' may be lower than the first thickness d1 of the lower electrode layer 95, e.g., the second thickness d2 may equal the reduced thickness of the lower electrode layer 95 after formation of the first oxide layer 75 thereon. A surface of the lower electrode 95' may be substantially smooth, i.e., a substantially flat surface with substantially no irregular columnar deviations as compared to the lower electrode layer 95. For example, as illustrated in FIG. 12, the surface of the lower electrode 95' may be substantially uniform and even. As illustrated in FIG. 11, a side of the lower electrode 95' may be in, e.g., direct, contact with the support pattern 87'. The support pattern 87' may prevent the lower electrode 95' from falling down.

Figure 13:
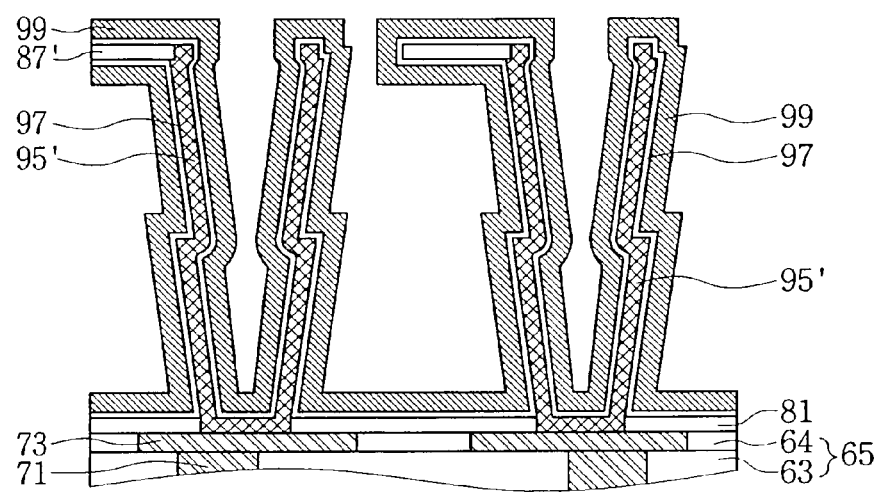

Referring to FIG. 13, a capacitor dielectric layer 97 may be formed, e.g., conformally, on the lower electrode 95', i.e., to cover the lower electrode 95' (S70 of FIG. 1). An upper electrode 99 may be formed, e.g., conformally, on the capacitor dielectric layer 97 (S80 of FIG. 1).

The lower electrode 95' may be formed in a cylinder or a cup shape. The capacitor dielectric layer 97 may cover inner and outer walls of the lower electrode 95' to a uniform thickness. The capacitor dielectric layer 97 may cover the exposed surface of the lower electrode 95', the support pattern 87', and the etch stop layer 81. The capacitor dielectric layer 97 may be formed, e.g., by a CVD method, an ALD method, and/or a cyclic deposition method. The capacitor dielectric layer 97 may be formed, e.g., of a silicon oxide layer, a silicon nitride layer, a silicon oxynitride layer, a metal oxide layer, and/or a metal silicate layer.

The upper electrode 99 may be formed of one or more of a TiN layer, a TaN layer, a ZrN layer, a HfN layer, a NbN layer, a TiAlN layer, a TaAlN layer, a Ti layer, a Ta layer, a Zr layer, a Hf layer, a Nb layer, a Ru layer, a RuO layer, an Ir layer, a Pt layer, etc. The upper electrode 99 may cover the lower electrode 95'. The upper electrode 99 may cover the lower electrode 95', the support pattern 87', and the etch stop layer 81. The capacitor dielectric layer 97 may be interposed between the lower electrode 95' and the upper electrode 99.

According to the first example embodiment, pollutants may be completely removed from the trench 92 when the surface oxide layer 77 is removed. Accordingly, the capacitor dielectric layer 97 may be formed on, e.g., directly on, the lower electrode 95' to have substantially uniform thickness and composition ratio. That is, the capacitor dielectric layer

97 may exhibit very uniform permittivity and excellent reliability on the entire surface of the substrate.

Second Example Embodiment

FIGS. 14 to 20 illustrate cross-sectional views of stages in a method of forming a semiconductor device having a capacitor according to a second example embodiment.

Figure 14:
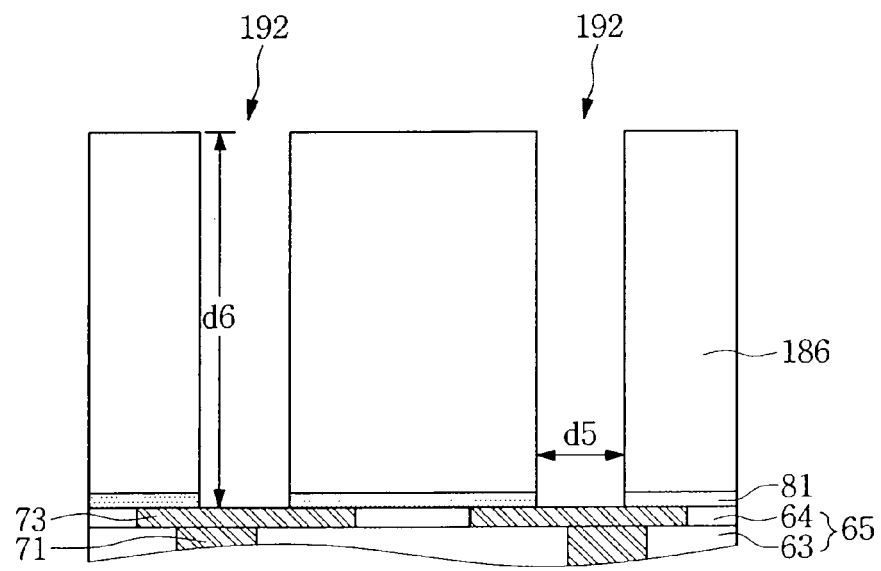
FIGS. 14 to 20 illustrate cross-sectional views of stages in a method of forming a semiconductor device having a capacitor according to another example embodiment.

Referring to FIG. 14, the lower insulating layer 65, the buried contact plug 71 and the landing pad 73 may be formed on the substrate (not shown). The lower insulating layer 65 may include the first insulating layer 63 and the second insulating layer 64. The landing pad 73 and the buried contact plug 71 may be formed in plural number to be, e.g., regularly, arranged in row and column directions. The landing pads 73 may be omitted.

The etch stop layer 81 and a molding layer 186 may be sequentially formed on the substrate having the lower insulating layer 65 and the landing pads 73 (S10 of FIG. 1).

The molding layer 186 may be formed of a material layer having a higher etch rate than the etch stop layer 81. For example, a ratio of an etch rate of the molding layer 186 to an etch rate of the etch stop layer 81 may be about 100:1 or higher. The molding layer 186 may be formed, e.g., of a silicon oxide layer.

The molding layer 186 and the etch stop layer 81 may be patterned to form a trench 192 (S20 of FIG. 1). The trench 192 may expose the landing pad 173. The trench 192 may be substantially the same as the trench 92 in the first example embodiment, with the exception of its shape.

The molding layer 186 may be patterned by photolithography and etching processes using a photoresist pattern and/or a hard mask pattern. The landing pads 73 may be exposed on a bottom of the trench 192. The trench 192 may be formed to a first width d5 and a first depth d6. The trench 192 may be formed in the shape of a cylinder or a cup having a high aspect ratio. For example, the ratio between the first width d5 and the first depth d6 may be about 1:25 or higher. The trench 192 may be formed in plural number to be, e.g., regularly, arranged in row and column directions to correspond to the landing pad 73 and/or the buried contact plug 71.

Figure 15:
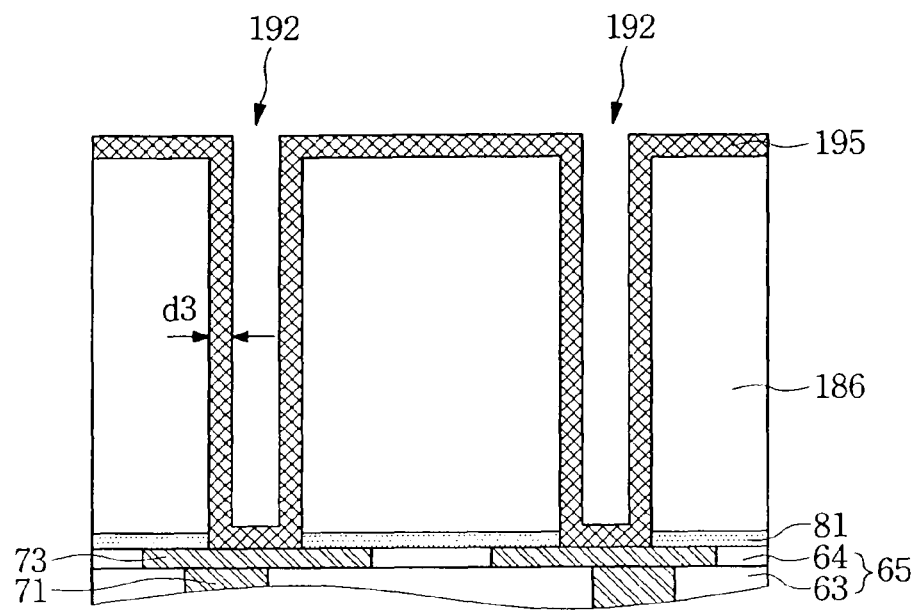

Referring to FIG. 15, the lower electrode layer 195 may be formed on the substrate having the trench 192 (S30 of FIG. 1). The lower electrode layer 195 may be formed of a conductive layer having an etch selectivity with respect to the molding layer 186'. The lower electrode layer 195 may be formed of one or more of a TiN layer, a TaN layer, a ZrN layer, a HfN layer, a NbN layer, a TiAlN layer, a TaAlN layer, a Ti layer, a Ta layer, a Zr layer, a Hf layer, a Nb layer, a Ru layer, a RuO layer, an Ir layer, a Pt layer, etc. The lower electrode layer 195 may be formed to a third thickness d3. It is noted that the lower electrode layer 195 may be substantially the same as the lower electrode layer 95 in the first example embodiment, with the exception of its conformal shape with respect to the shape of the trench 192. Therefore, the lower electrode layer 195 may have an uneven surface.

The lower electrode layer 195 may cover an inner wall of the trench 192. As illustrated in FIG. 15, the lower electrode layer 195 and the trench 192 may be formed to have a uniform thickness along the inner wall of the trench 192. The lower electrode layer 195 may cover the landing pad 73. When the landing pad 73 is omitted, the lower electrode layer 195 may be in contact with the buried contact plug 71. The lower electrode layer 195 may be formed by a PVD method, a CVD method, an ALD method, a cyclic deposition method, an electroplating method, an electroless plating method, or a combination thereof. For example, the lower electrode layer 195 may be formed of a TiN layer by a PVD method. The lower electrode layer 195 may be formed of a conductive layer exhibiting a lower etch rate than the molding layer 186. For example, a ratio of an etch rate of the lower electrode layer 195 to an etch rate of he molding layer 186 may be about 1:100 or higher.

Figure 16:
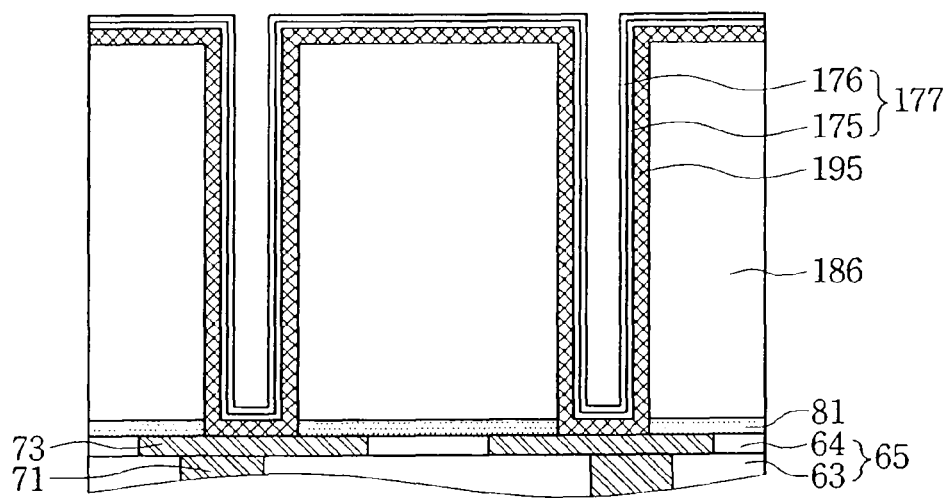

Referring to FIG. 16, a surface oxide layer 177 may be formed on the lower electrode layer 195 (S40 of FIG. 1). The surface oxide layer 177 may include a first oxide layer 175 covering the lower electrode layer 195 and a second oxide layer 176 covering the first oxide layer 175. The first oxide layer 175 and the second oxide layer 176 may be formed in an in-situ process. That is, the first oxide layer 175 and the second oxide layer 176 may be successively formed in the same equipment.

In the second example embodiment, the first oxide layer 175 may be formed by an $O_3$ pre-flow process. For example, when the lower electrode layer 195 is formed of a TiN layer, the first oxide layer 175 may be formed of a $TiO_2$ layer. The second oxide layer 176 may be formed of a metal oxide layer by a CVD method, an ALD method, a cyclic deposition method and/or a combination thereof. For example, the second oxide layer 176 may be formed of an AlO layer.

In some example embodiments, the first oxide layer 175 may be formed by an oxidation process using one or more of $O_2$, $O_3$, and H2O. The second oxide layer 176 may be formed by a deposition process using one or more of $O_2$, $O_3$, and $H_2O$. Also, the second oxide layer 176 may be formed by a metal oxide layer deposition process. The first oxide layer 175 may be formed to a thickness of about 0.1 nm to about 2 nm, e.g., about 1 nm. It is noted that surface oxide layer 177 may be substantially the same as the surface oxide layer 77 in the first example embodiment, with the exception of its conformal shape with respect to the shape of the trench 192.

Figure 17:
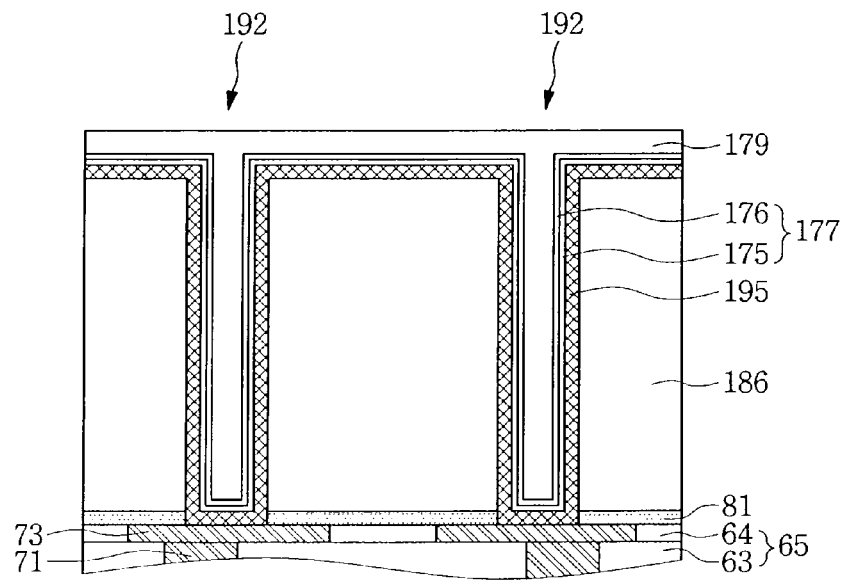

Referring to FIG. 17, a sacrificial layer 179 filling the trench 192 and covering the surface oxide layer 177 may be formed (S50 of FIG. 1). The sacrificial layer 179 may be formed of a hydrocarbon-based organic polymer layer. For example, the sacrificial layer 179 may be formed of an ONSP layer. Alternatively, the sacrificial layer 179 may be formed of a silicon oxide layer using a CVD method, an ALD method, a cyclic deposition method, or a combination thereof. In other example embodiments, the sacrificial layer 179 may be omitted.

Figure 18:
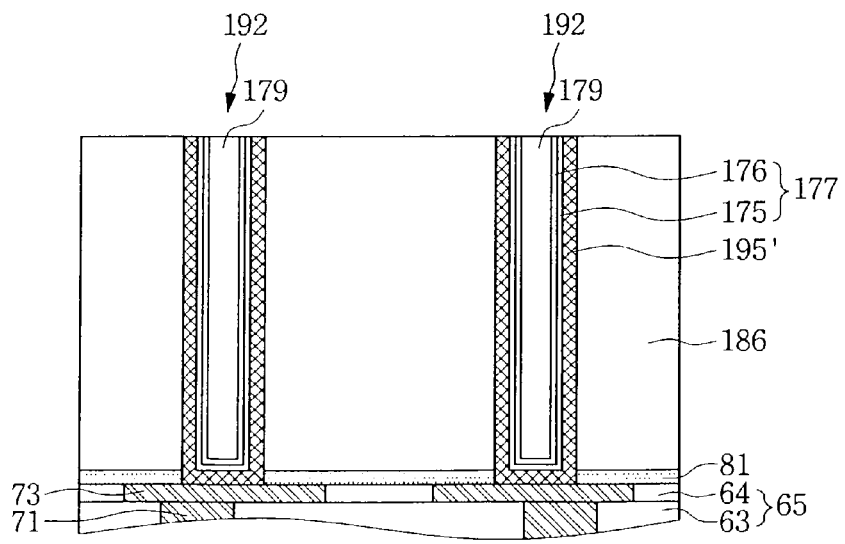

Referring to FIG. 18, a lower electrode 195' may be formed by a node splitting process (S60 of FIG. 1). The lower electrode 195' may be in contact with the landing pad 73. The lower electrode 195' may be formed in plural number to be regularly arranged in row and column directions to correspond to the trench 192.

The node splitting process may include a CMP process, an etch-back process and/or a combination thereof. For example, the lower electrode 195' may be formed by a CMP process using the molding layer 186 as a stop layer. As a result, top surfaces of the molding layer 186, the lower electrode 195', the surface oxide layer 177, and the sacrificial layer 179 may be exposed on the same plane. The sacrificial layer 179 may remain in the trench 192. The surface oxide layer 177 may remain between the lower electrode 195' and the sacrificial layer 179.

Figure 19:
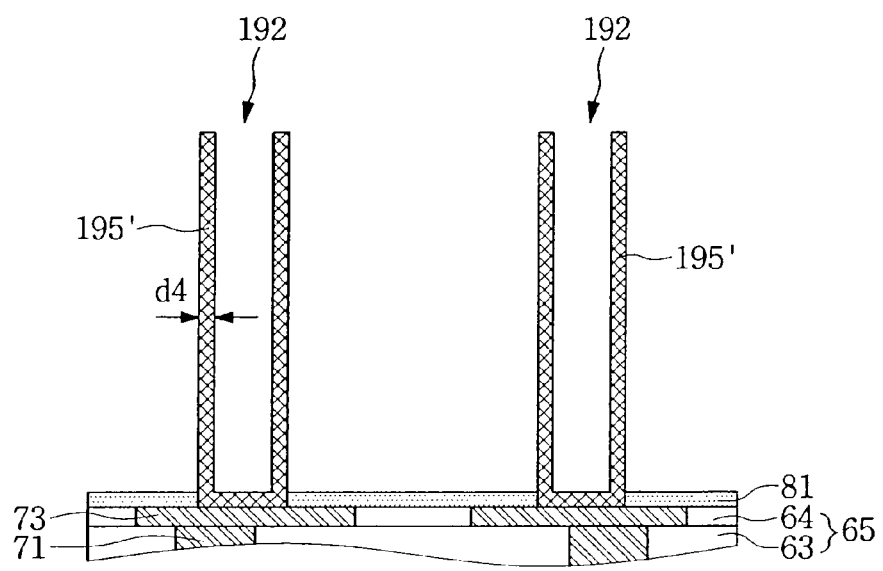

Referring to FIG. 19, the molding layer 186, the sacrificial layer 179, and the surface oxide layer 177 may be removed to expose the lower electrode 195'. The molding layer 186, the sacrificial layer 179, and the surface oxide layer 177 may be removed using an ashing process, an isotropic etching process, and/or a combination thereof. As a result, the etch stop layer 81 may be exposed as well.

While the sacrificial layer 179 is removed, pollutants, e.g., polymer residue, may remain in the trench 192. However, the pollutants may be removed as well, while the surface oxide layer 177 is removed. As a result, the surface oxide layer 177 may serve to prevent surface contamination of the lower electrode 195'. The lower electrode 195' may be formed to have a fourth thickness d4. The fourth thickness d4 of the lower electrode 195' may be lower than the third thickness d3 of the lower electrode layer 195. A surface of the lower electrode 195' may be more smoothly formed than the lower electrode layer 195.

Figure 20:
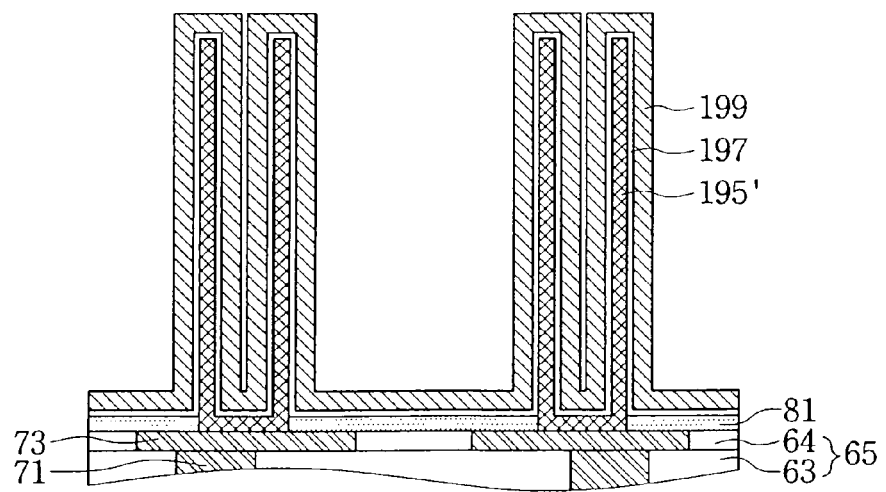

Referring to FIG. 20, a capacitor dielectric layer 197 covering the lower electrode 195' may be formed (S70 of FIG. 1). An upper electrode 199 may be formed on the capacitor dielectric layer 197 (S80 of FIG. 1).

The lower electrode 195' may be formed in a cylinder or a cup shape. The capacitor dielectric layer 197 may cover inner and outer walls of the lower electrode 195' to a uniform thickness. The capacitor dielectric layer 197 may cover the exposed surface of the lower electrode 195', and the etch stop layer 81.

The upper electrode 199 may be formed of one or more of a TiN layer, a TaN layer, a ZrN layer, a HfN layer, a NbN layer, a TiAlN layer, a TaAlN layer, a Ti layer, a Ta layer, a Zr layer, a Hf layer, a Nb layer, a Ru layer, a RuO layer, an Ir layer, a Pt layer, etc. The upper electrode 199 may cover the lower electrode 195', and the etch stop layer 81. The capacitor dielectric layer 197 may be interposed between the lower electrode 195' and the upper electrode 199.

According to the second example embodiment, pollutants remaining in the trench 192 may be completely removed while the surface oxide layer 177 is removed. Accordingly, the capacitor dielectric layer 197 may exhibit a uniform thickness and composition ratio. That is, the capacitor dielectric layer 197 may exhibit very uniform permittivity and excellent reliability on the entire surface of the substrate.

Third Example Embodiment

Figure 21:
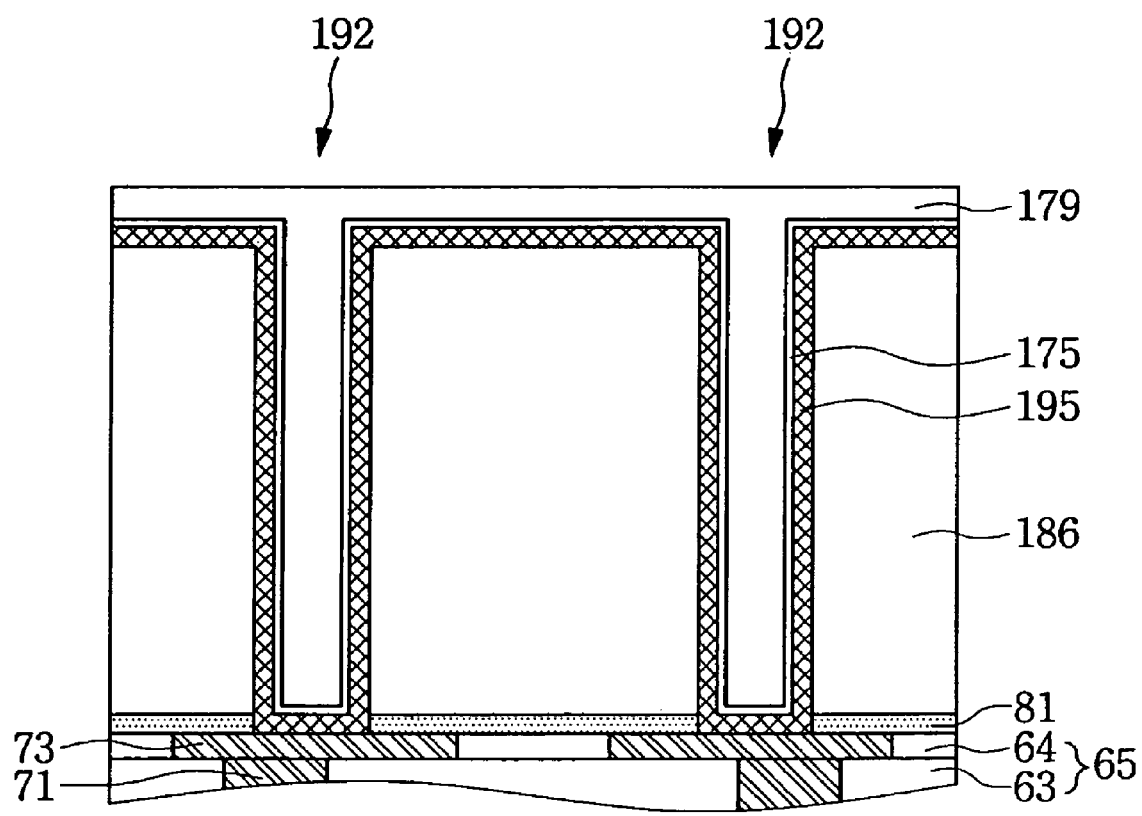
FIG. 21 illustrates a cross-sectional view of a method of forming a semiconductor device having a capacitor according to another example embodiment.

FIG. 21 illustrates a cross-sectional view of a method of forming a semiconductor device having a capacitor according to a third example embodiment. The method may be substantially the same as the second exemplary embodiment, with the exception of having only the first oxide layer 175 as a surface oxide layer.

Referring to FIG. 21, the lower insulating layer 65, the buried contact plug 71, and the landing pad 73 may be formed on the substrate (not shown). The lower insulating layer 65 may include the first insulating layer 63 and the second insulating layer 64. The landing pad 73 and the buried contact plug 71 may be formed in plural number to be regularly arranged in row and column directions. The landing pad 73 may be omitted. Only a difference from the second example embodiment will be briefly described below.

The etch stop layer 81 and the molding layer 186 may be sequentially formed on the substrate having the lower insulating layer 65 and the landing pads 73 (S10 of FIG. 1). The molding layer 186 and the etch stop layer 81 may be patterned to form the trench 192 (S20 of FIG. 1). The trench 192 may be formed in plural number to be regularly arranged in row and column directions to correspond to the landing pad 73 and/or the buried contact plug 71.

The lower electrode layer 195 may be formed on the substrate having the trench 192 (S30 of FIG. 1). The first oxide layer 175 may be formed on the lower electrode layer 195 as a surface oxide layer (S40 of FIG. 1).

In detail, the first oxide layer 175 may be formed by an $O_3$ pre-flow process. For example, when the lower electrode layer 195 is formed of a TiN layer, the first oxide layer 175 may be formed of a $TiO_2$ layer. The sacrificial layer 179 may be deposited in the trench 192 in direct contact with the first oxide layer 175. The remaining stages may be substantially the same as described previously with reference to FIGS. 17-20.

Fourth Example Embodiment

Figure 22:
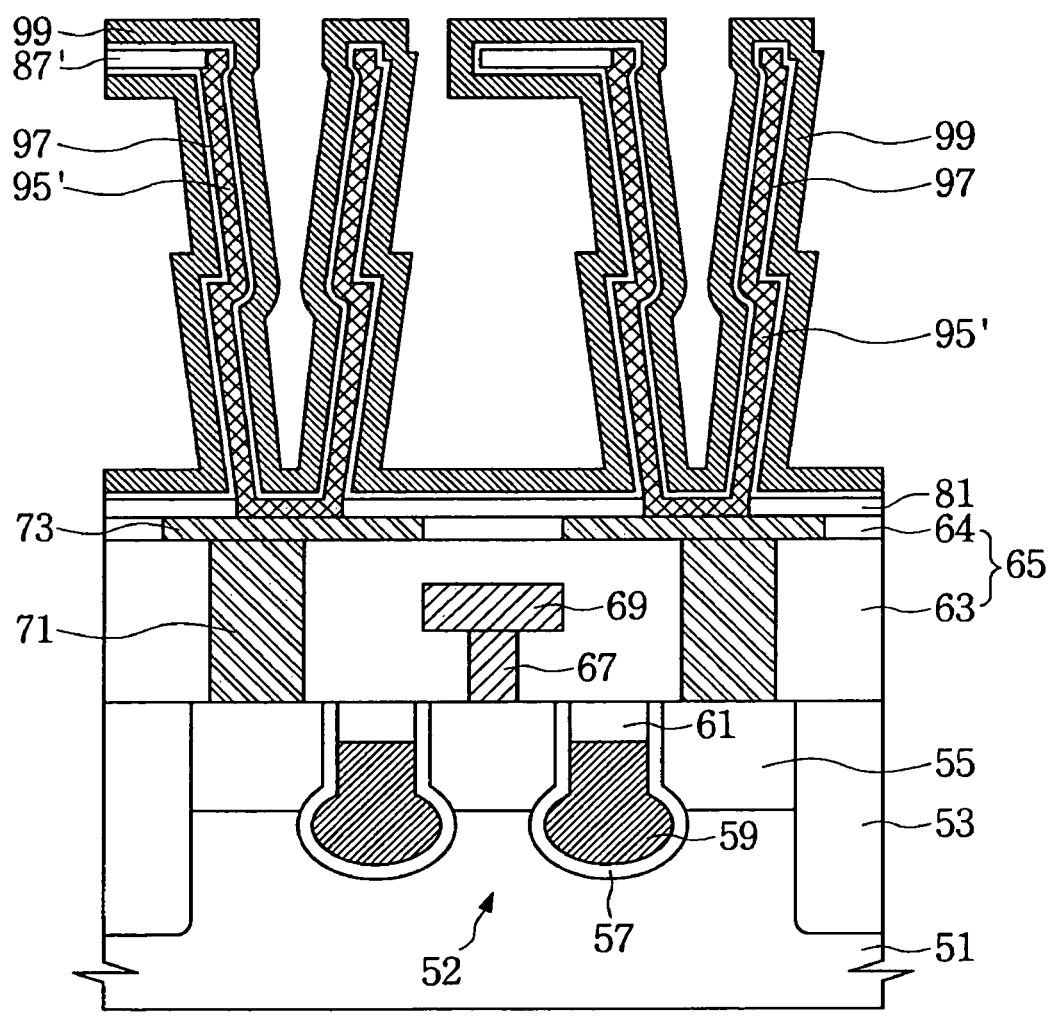
FIG. 22 illustrates a cross-sectional view of a method of forming a semiconductor device having a capacitor according to another example embodiment.

FIG. 22 illustrates a cross-sectional view of a method of forming a semiconductor device having a capacitor according to a fourth example embodiment. The semiconductor device according to the fourth example embodiment may include a DRAM cell array.

Referring to FIG. 22, an isolation layer 53 defining an active region 52 may be formed in a substrate 51. A gate dielectric layer 57, a gate electrode 59, and a capping pattern 61 crossing the active region 52 may be formed. Source/drain regions 55 may be formed in the active region 52 adjacent to both sides of the gate electrode 59.

The substrate 51 may be a semiconductor substrate, e.g., including one or more of a silicon wafer, a silicon on insulator (SOI) wafer, and/or a compound semiconductor wafer. The isolation layer 53 may be formed using a shallow trench isolation (STI) technique. The isolation layer 53 may be formed of an insulating layer, e.g., a silicon oxide layer, a silicon nitride layer, a silicon oxynitride layer, and/or a combination thereof. The gate electrode 59 may be buried in a gate trench formed in the active region 52. A lower part of the gate electrode 59 may have a greater width than an upper part, and when seen from a cross-sectional view, a lower region of the gate electrode 59 may have a spherical shape. The gate electrode 59 may be formed of a conductive layer, e.g., a polysilicon layer, a metal silicide layer, a metal layer, a metal nitride layer, and/or a combination thereof. The capping pattern 61 may cover the gate electrode 59. The capping pattern 61 may be formed of an insulating layer, e.g., a silicon oxide layer, a silicon nitride layer, a silicon oxynitride layer, and/or a combination thereof.

The lower insulating layer 65, a bit plug 67, a bit line 69, the buried contact plug 71, and the landing pad 73 may be formed on the substrate 51 having the gate electrode 59. The lower insulating layer 65 may include the first insulating layer 63 covering the substrate and the second insulating layer 64 covering the first insulating layer 63. Only a difference from the first example embodiment will be described below.

The bit line 69 may be formed in the first insulating layer 63. The bit plug 67 may penetrate the first insulating layer 63 to be in contact with a selected one of the source/drain regions 55. One end of the bit plug 67 may be in contact with the bit line 69. The bit line 69 and the bit plug 67 may be formed of a conductive layer, e.g., a polysilicon layer, a metal silicide layer, a metal layer, a metal nitride layer, and/or a combination thereof.

The buried contact plug 71 may penetrate the first insulating layer 63. The landing pad 73 may be formed on the first insulating layer 63. The landing pad 73 may be in contact with the buried contact plug 71. The lower insulating layer 65 and the landing pad 73 may be formed to have planarized top surfaces. In such a case, the top surfaces of the landing pad 73 and the second insulating layer 64 may be exposed on substantially the same plane. The landing pad 73 and the buried contact plug 71 may be formed in plural number to be regularly arranged in row and column directions.

The etch stop layer 81, the lower electrode 95', the support pattern 87', the capacitor dielectric layer 97, and the upper electrode 99 may be formed using the method described previously with reference to FIGS. 2 to 13.

According to example embodiments, a surface oxide layer and a sacrificial layer may be sequentially formed on a surface of a lower electrode layer, followed by removal of the sacrificial layer and the surface oxide layer. While the surface oxide layer is removed, potential pollutants remaining in the trench may be completely removed. Then, a capacitor dielectric layer and an upper electrode may be formed on the lower electrode. That is, the capacitor dielectric layer may exhibit very uniform permittivity and excellent reliability on the entire surface of the substrate.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
    forming a lower electrode layer on a substrate;
    forming a surface oxide layer on the lower electrode layer;
    partially removing the lower electrode layer to form a lower electrode;
    removing the surface oxide layer to expose the lower electrode;
    forming a capacitor dielectric layer on the lower electrode; and
    forming an upper electrode on the capacitor dielectric layer,
    wherein forming the surface oxide layer includes performing one or more of a pre-flow process, an oxidation process, and a deposition process.

2. The method as claim in claim 1, wherein forming the surface oxide layer includes performing one or more of an $O_3$ pre-flow process, an oxidation process using $O_2$, $O_3$, and/or $H_2O$, and a deposition process using $O_2$, $O_3$, $H_2O$, a metal source gas, and/or a silicon source gas.

3. The method as claimed in claim 1, wherein forming the surface oxide layer includes:
    forming a first oxide layer on the lower electrode layer using a pre-flow process or an oxidation process; and
    forming a second oxide layer on the first oxide layer by a deposition process using one or more of $O_2$, $O_3$, $H_2O$, a metal source gas, and/or a silicon gas.

4. The method as claimed in claim 1, wherein the second oxide layer is formed of an AlO layer.

5. The method as claimed in claim 1, further comprising:
    forming a molding layer on the substrate; and
    patterning the molding layer to form a trench, such that the lower electrode layer covers a sidewall of the trench.

6. The method as claimed in claim 1, wherein the lower electrode layer is formed of one or more of a TiN layer, a TaN layer, a ZrN layer, a HfN layer, a NbN layer, a TiAlN layer, a TaAlN layer, a Ti layer, a Ta layer, a Zr layer, a Hf layer, a Nb layer, a Ru layer, a RuO layer, an Ir layer, and a Pt layer.

7. The method as claimed in claim 1, wherein the lower electrode is formed to be thinner than the lower electrode layer.

8. The method as claimed in claim 1, wherein the surface oxide layer is conformally formed on the lower electrode layer.

9. The method as claimed in claim 1, further comprising forming a supporter pattern contacting the lower electrode, wherein the supporter pattern is formed in a line and space pattern.

10. The method as claimed in claim 5, wherein forming the molding layer includes sequentially stacking a first molding layer, a second molding layer, and a third molding layer, wherein the first molding layer, the second molding layer, and the third molding layer have different etch selectivities.

11. The method as claimed in claim 5, further comprising forming a sacrificial layer on the lower electrode to fill the trench, wherein exposing the lower electrode includes removing the molding layer and the sacrificial layer.

12. The method as claimed in claim 9, wherein the supporter pattern includes two sides opposite each other, and each of the two sides contact with a plurality of lower electrodes.

13. The method as claimed in claim 10, wherein forming the molding layer includes:
    forming the first molding layer of boro-phospho silicate glass (BPSG);
    forming the second molding layer of a tetra ethyl ortho silicate (TEOS); and
    forming the third molding layer of a low deposition rate tetra ethyl ortho silicate (LDTEOS).

14. The method as claimed in claim 10, further comprising forming a supporter layer between the second molding layer and the third molding layer, wherein the supporter layer is formed of a material layer having an etch selectivity with respect to the molding layer, and the lower electrode layer is in contact with a sidewall of the supporter layer.

15. The method as claimed in claim 11, wherein the sacrificial layer is formed of a hydrocarbon-based organic polymer layer.

16. The method as claimed in claim 11, wherein the sacrificial is formed of an organic node separate photoresist (ONSP) layer.

17. A method of forming a semiconductor device, comprising:
    forming a lower electrode layer on a substrate;
    forming a surface oxide layer on the lower electrode layer;
    partially removing the lower electrode layer to form a lower electrode;
    removing the surface oxide layer to expose the lower electrode;
    forming a capacitor dielectric layer on the lower electrode; and
    forming an upper electrode on the capacitor dielectric layer,
    wherein forming the surface oxide layer includes forming at least one oxide layer directly on the lower electrode layer by performing a pre-flow process and/or an oxidation process on the lower electrode.

18. The method as claimed in claim 17, wherein forming the at least one oxide layer directly on the lower electrode layer includes forming a planarized interface between the at least one oxide layer and the lower electrode layer.

19. The method as claimed in claim 17, further comprising forming a sacrificial layer on the at least one oxide layer, such that the oxide layer is between the sacrificial layer and the lower electrode layer,
    wherein removing the surface oxide layer includes removing the at least one oxide layer and the sacrificial layer to expose the lower electrode.

20. A method of forming a semiconductor device, comprising:
    forming a lower electrode layer on a substrate;

forming a surface oxide layer on the lower electrode layer;
partially removing the lower electrode layer to form a lower electrode;
removing the surface oxide layer to expose the lower electrode;
forming a capacitor dielectric layer on the lower electrode; and
forming an upper electrode on the capacitor dielectric layer,
wherein forming the surface oxide layer includes:
forming a first oxide layer on the lower electrode layer by performing one or more of an $O_3$ pre-flow process or an oxidation process using $O_2$, $O_3$, and/or $H_2O$; and
forming a second oxide layer on the first oxide layer by a deposition process using one or more of $O_2$, $O_3$, $H_2O$, a metal source gas, and/or a silicon gas.

* * * * *